United States Patent
Magliocco et al.

(10) Patent No.: US 7,861,059 B2
(45) Date of Patent: Dec. 28, 2010

(54) METHOD FOR TESTING AND PROGRAMMING MEMORY DEVICES AND SYSTEM FOR SAME

(75) Inventors: Paul Magliocco, Monte Sereno, CA (US); Young Cheol Kim, Saratoga, CA (US); Richard Mark Greene, Los Gatos, CA (US); John M. Holmes, Campbell, CA (US)

(73) Assignee: Nextest Systems Corporation, San Jose, CA (US)

( * ) Notice: Subject to any disclaimer, the term of this patent is extended or adjusted under 35 U.S.C. 154(b) by 562 days.

(21) Appl. No.: 11/051,325

(22) Filed: Feb. 3, 2005

(65) Prior Publication Data

US 2005/0193233 A1 Sep. 1, 2005

Related U.S. Application Data

(60) Provisional application No. 60/541,555, filed on Feb. 3, 2004.

(51) Int. Cl.
*G06F 12/00* (2006.01)
*G06F 13/00* (2006.01)
*G06F 13/28* (2006.01)

(52) U.S. Cl. .................... 711/220; 711/E12.089
(58) Field of Classification Search ............ 714/5; 365/200, 185; 711/220
See application file for complete search history.

(56) References Cited

U.S. PATENT DOCUMENTS

| | | | | |
|---|---|---|---|---|
| 5,539,697 A | * | 7/1996 | Kim et al. ............. 365/200 |
| 5,671,229 A | * | 9/1997 | Harari et al. ............. 714/710 |
| 5,854,767 A | * | 12/1998 | Nishi et al. ............. 365/219 |
| 5,886,708 A | * | 3/1999 | Wakasu ............. 345/592 |
| 5,959,929 A | * | 9/1999 | Cowles et al. ............. 365/230.03 |
| 6,236,593 B1 | * | 5/2001 | Hong et al. ............. 365/185.11 |
| 6,260,156 B1 | * | 7/2001 | Garvin et al. ............. 714/8 |
| 6,496,876 B1 | * | 12/2002 | Rohwer ............. 710/3 |
| 6,717,858 B2 | * | 4/2004 | Kawai et al. ............. 365/185.22 |
| 6,839,292 B2 | * | 1/2005 | Gatzemeier et al. ............. 365/200 |
| 7,181,592 B2 | * | 2/2007 | Pascucci ............. 711/219 |
| 2002/0133767 A1 | * | 9/2002 | Cowles ............. 714/719 |
| 2003/0133333 A1 | * | 7/2003 | Eldredge et al. ............. 365/200 |
| 2010/0064197 A1 | * | 3/2010 | Halter ............. 714/755 |

* cited by examiner

*Primary Examiner*—Sheng-Jen Tsai
(74) *Attorney, Agent, or Firm*—Dorsey & Whitney LLP

(57) ABSTRACT

A method and system are provided for programming a plurality of memory devices arranged in parallel. In one embodiment of the present invention, the plurality of memory devices comprises first and second memory devices, and the method comprises providing successively the first address to the first memory device and the second address to the second memory device. The first address refers to a first group of storage locations in the first memory device and the second address refers to a second group of storage locations in the second memory device. The method then proceeds to load in parallel a string of data to the first and second memory devices so that the string of data is written simultaneously to the first group of storage locations in the first memory device and to the second group of storage locations in the second memory device.

18 Claims, 9 Drawing Sheets

METHOD FOR TESTING AND PROGRAMMING MEMORY DEVICES AND SYSTEM FOR SAME

CROSS REFERENCE TO RELATED APPLICATIONS

The present application claims priority to U.S. Provisional Patent Application No. 60/541,555 filed on Feb. 3, 2004, the entire content of which is incorporated herein by this reference.

FIELD OF THE INVENTION

The present invention relates in general to integrated circuit testing technologies, and more particularly to a system and method for automatic testing of memory devices.

BACKGROUND OF THE INVENTION

Manufacturers of integrated circuit (IC) devices use test systems or testers to weed out defective devices at various points in a manufacturing process. Broadly, there are two types of digital testers, those suitable for testing memory arrays or circuits, such as flash memory or Random Access Memories (RAM), and those suitable for testing logic circuits, such as Micro Controllers, Application Specific ICs (ASICs), and Programmable Logic Devices (PLDs). Common types of flash memory devices include NOR Flash, NAND Flash, and Serial Data Flash memories.

Flash memory devices are often produced with various data organizations. As part of a typical manufacturing test process, both algorithmic and non-algorithmic data patterns may be programmed into the device. Furthermore, customers often want specific codes, such as a cell phone operating system, programmed into the devices by the manufacturer before receiving the devices. Data patterns or customer specific codes are programmed at specific locations in the Flash memory device with each data word identified by a row address and a column address.

A NAND Flash memory device has storage cells internally organized as rows of data. Each row typically has 512 user programmable cells, or data bits, and ten to twenty additional bits for use by the device manufacturer to store device characteristics and defect information. Usually, rows are grouped together into "blocks," with each block typically having eight to sixty-four rows. User data is programmed into the NAND Flash rows in a serial fashion by loading a high-speed shift register that mirrors a row, and then simultaneously transferring the data from the shift register into all data bits in the row.

Monolithic NAND Flash devices often contain as many as two billion individual storage locations or cells. With this big a number of storage locations on one integrated circuit, it is often difficult to manufacture perfect devices with 100% functional storage locations. For this reason, extra rows of storage cells are designed into Flash memories in such a way that they can be used to replace defective or otherwise inoperable storage cells. Replacement of defective cells is usually done at the block level with a good replacement block being substituted for a block with defective cells. In the IC industry, the extra cells are called "redundant elements" or "redundant cells" and the repair of a defective device is called "redundancy repair".

When a defective block is detected in a testing process, the address of the defective block is entered in a "bad block table," which is stored in designated locations of the Flash memory device. The bad block table can later be used to locate defective storage elements. From this point in the device manufacturing flow, the defective block is no longer programmed with test data patterns or customer codes. If there are more defective blocks than there are redundant blocks, the device is considered "unrepairable" and is discarded.

SUMMARY OF THE INVENTION

Because of the large number of storage cells in a Flash memory device, the device may take a long time to program. Manufacturing test time per flash memory device is usually measured in minutes. To reduce the cost of testing, IC manufacturers often test many IC devices simultaneously, or "in parallel." Simultaneous or parallel testing of multiple flash memory devices, however, cannot be easily done because each flash memory device usually has a different set of bad blocks so that a series of data patterns may need to be programmed at different row addresses in different flash memory devices. The problem becomes more complicated when more flash memory devices are involved.

The present invention provides a method for programming a plurality of memory devices arranged in parallel. In one embodiment of the present invention, the plurality of memory devices comprises first and second memory devices, and the method comprises providing successively the first address to the first memory device and the second address to the second memory device. The first address refers to a first group of storage locations in the first memory device and the second address refers to a second group of storage locations in the second memory device. The method then proceeds to load in parallel a string of data to the first and second memory devices so that the string of data is written simultaneously to the first group of storage locations in the first memory device and to the second group of storage locations in the second memory device.

The present invention also provides a system for programming a plurality of memory devices in parallel. In one embodiment of the present invention, the plurality of memory devices comprises first and second memory devices, and the system comprises an address generator configured to generate successively a memory address for the first memory device and the same memory address for the second memory device. The system further comprises an address adjuster coupled between the address generator and the plurality of memory devices and configured to determine whether a storage unit in the first memory device corresponding to the memory address is inoperable. In response to the determination that the storage unit is inoperable, the address adjuster is configured to generate a first modified address to bypass a first collection of storage locations comprising the inoperable storage unit. The first modified address is provided to the first memory device.

The address adjuster is also configured to determine whether a storage unit in the second memory device corresponding to the memory address is inoperable. In response to the determination that the storage unit is inoperable, the address adjuster is configured to generate a second modified address to bypass a second collection of storage location comprising the inoperable storage location. The second modified address is provided to the second memory device subsequent to the first modified address being provided to the first memory device. In one embodiment of the present invention, the first modified address refers to a first group of storage locations in the first memory device and the second modified address refers to a second group of storage locations in the second memory device, and the system comprises a data buffer memory storing therein data patterns corresponding to the first group of storage locations in the first memory device and to the second group of storage locations in the second memory device. The data buffer memory is configured to output the data patterns to the first memory device and to the second memory device in parallel so that the data patterns are written simultaneously to the first group of storage locations in the first memory device and to the second group of storage locations in the second memory device.

DETAILED DESCRIPTION OF THE INVENTION

Figure 1:
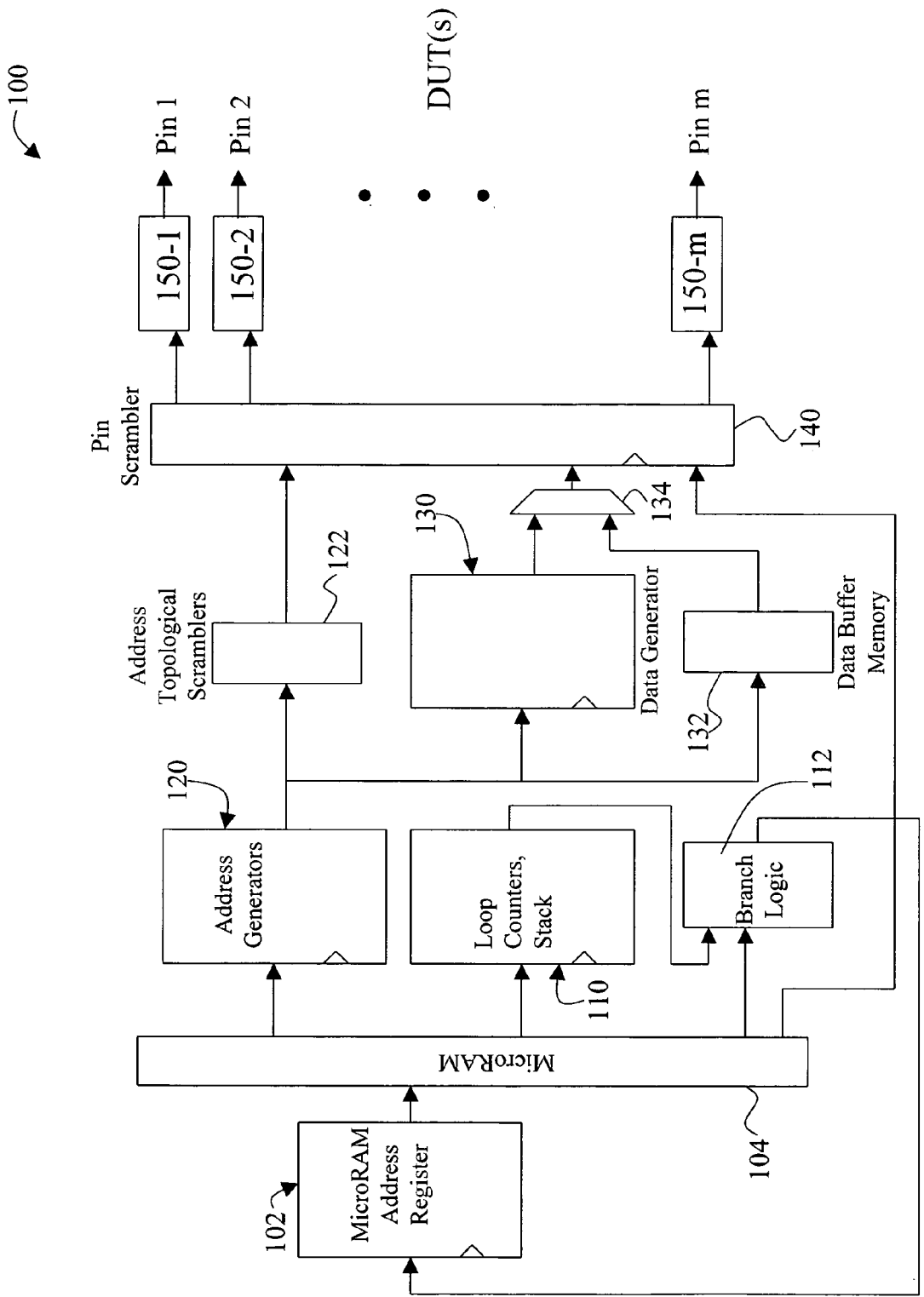
FIG. 1 is a block diagram of a tester suitable for testing Flash memory devices in accordance with an embodiment of the present invention.

FIG. 1 is a block diagram of a tester 100 suitable for testing Flash memory devices in accordance with the method and system of the present invention. As shown in FIG. 1, tester 100 comprises a MicroRAM Address Register (MAR) 102 and a MicroRAM module 104 coupled to the MAR 102. Tester 100 further comprises an address generator 120, loop counters and stack 110, and a branch logic circuit 112, each of which is coupled to MicroRAM 104. Branch logic 112 is additionally coupled to loop counters and stack 110 and to MAR 102. Tester 100 further comprises address topological scramblers 122, a data generator 130, and data buffer memory 132, each of which is coupled to address generator 120. Tester 100 further comprises a multiplexor 134 coupled to data generator 130 and data buffer memory 132, and a pin scrambler 140 coupled to address topological scramblers 122, to multiplexor 134, and to MicroRAM 104. Pin scrambler 140 is additionally coupled to timing generators 150-1 through 150-m, which in turn are coupled to tester pins 1 through m, respectively, for driving one or more devices under test (DUTs) each having m pins or less. The number m is typically 64 for testing DUTs of 64 pins or less. A plurality of testers 100 can be packaged together to achieve a very high pin count test system for testing higher pin count DUTs or for testing more DUTs in parallel.

In normal operation, an algorithmic pattern gets loaded by a host computer (not shown) into the MicroRAM 104. A test site computer (not shown) and a clock (not shown) are coupled to tester 100 to provide timing or clock signals to tester 100 and to control its operation. MicroRAM Address Register 102 addresses MicroRAM 104, pointing to the next instruction to be executed. MicroRAM 104 outputs control bits to loop counters and stack 110 and to branch logic 112. Loop counters and stack 110 operates together with branch logic 112 to determine the next MicroRAM address to load into the MicroRAM Address Register 102. At the same time when the control bits are output, additional bits from MicroRAM 204 are sent to address generator 120. The output of address generator 120 drives address topological scramblers 122, data generator 230, and data buffer memory 132. Address topological scramblers 122 comprises Random Access Memory that provides a topologically true data pattern to the DUT's internal array (not shown) after passing through the DUT's address decoders (not shown).

The register-based data generator 230 algorithmically generates data patterns for the DUT(s). In addition to algorithmic data, non-algorithmic data patterns stored in data buffer memory 132, which comprises Random Access Memory that holds the non-algorithmic data patterns, are delivered as a function of address from address generator 120. The test program loaded in MicroRAM 104 controls which data source is sent to the DUT(s) through multiplexer 134 (control connections not shown). Pin scrambler 140 routes the outputs of address topological scramblers 122 and data multiplexer 134 to selected pins of the DUT(s) according to instructions from MicroRAM 104.

For purposes of clarity, many details of tester 100 that are either known or are not relevant to the present invention have been omitted. Descriptions related to these details can be found in commonly assigned U.S. Pat. No. 6,754,868 entitled Semiconductor Test System Having Double Data Rate Pin Scrambling, the entire content of which is incorporated herein by reference, and in commonly assigned co-pending U.S. patent application Ser. No. 10/431,043, filed 6 May 2003 and entitled Semiconductor Testing System Having Multitasking Algorithmic Pattern Generator; U.S. patent application Ser. No. 10/170,916, filed 12 Jun. 2002 and entitled Stackable Semiconductor Test System And Method For Operating Same; and U.S. patent application Ser. No. 10/039,738, filed 4 Jan. 2002 and entitled An Apparatus Having Pattern Scrambler For Testing A Semiconductor Device And Method For Operating Same; the entire content of each of which is incorporated herein by reference.

NAND Flash memories are generally low pin count devices, with a single NAND flash memory device having, for example, 16 pins. Because of their low pin count, multiple NAND Flash DUTs can be connected to one tester. For example, four 16 pin Flash memory devices could be connected to a 64-pin tester, such as tester 100. For maximum test throughput in this example, it would be preferred that the same tests be executed on all four DUTs at the same time. When defective or otherwise inoperable Flash memory storage locations are found as part of the testing process, the defective cells are logged in the bad block tables in the respective DUTs and those defective cells are bypassed for the remainder of the tests. In particular, test programming patterns and customer data patterns should not be programmed into bad blocks containing defective storage cells and should instead be shifted to the next available good block(s) of functioning storage cells.

Figure 2:
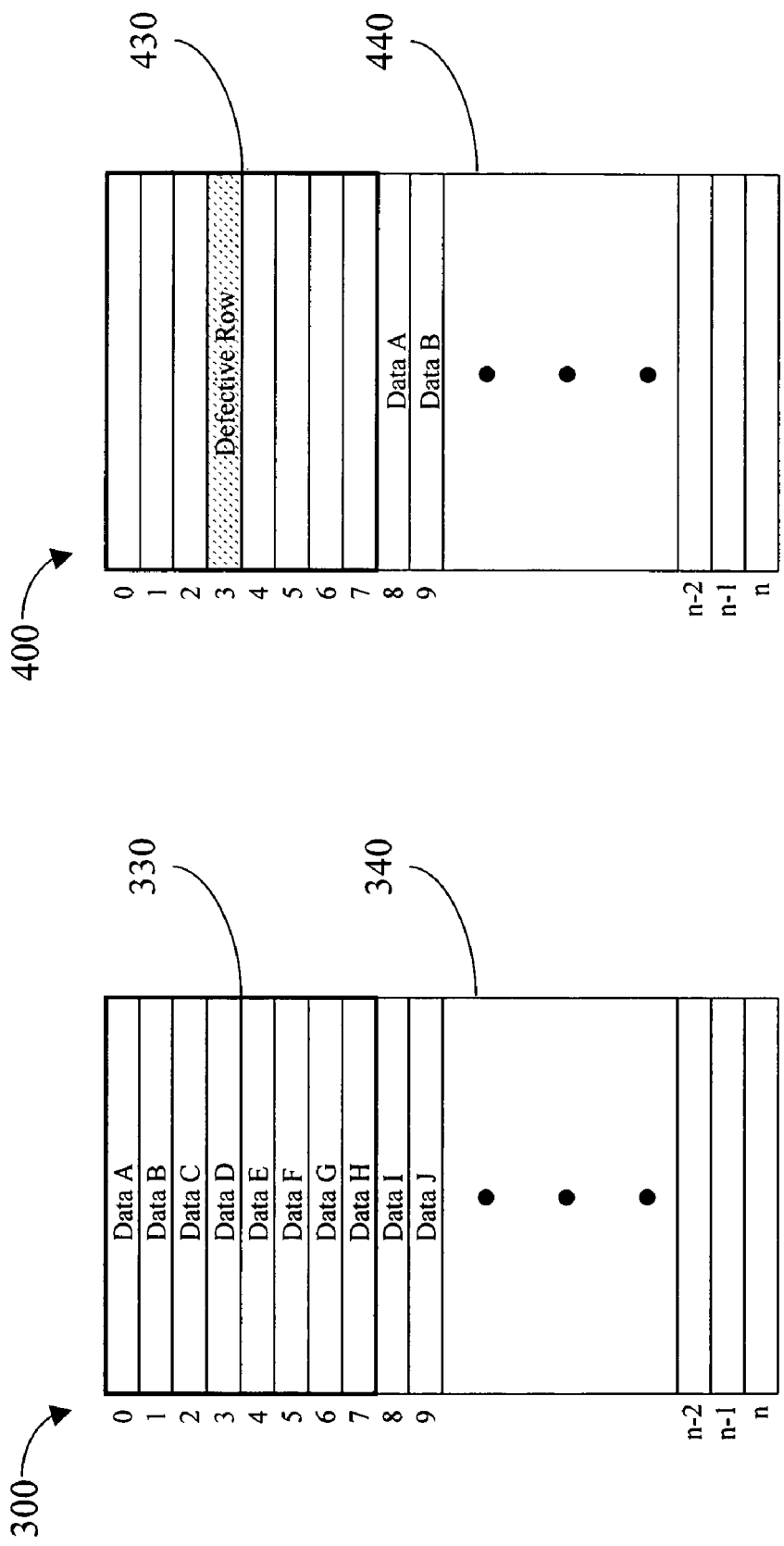
FIG. 2 is a block diagram illustrating a column of memory cells in each of two flash memory devices.

As an example, FIG. 2 illustrates a column of n+1 rows in each of two DUTs, DUT 300 and DUT 400, that are to be tested in parallel. Block 330 including rows 0 to 7 in DUT 300 is a good block and is programmed with data patterns, with Data A in row 0, Data B in row 1, . . . , and Data H in row 7. This continues if the next block, block 340 is also a good block so Data I is written into row 8, Data J is written into row 9, and so on. Block 430 in DUT 400 includes rows 0 to 7 in DUT 400. Block 430, however, should not be programmed because it includes a defective row, row 3, which causes the entire block 430 to be logged in the bad block table in DUT 400 and thus not usable. To program DUT 400 simultaneously with DUT 300, a tester would need to address DUT 400 differently from DUT 300 so that the same data patterns written into block 330 in DUT 300 is written into the next good block after block 430 in DUT 400 with, for example, Data A in row 8, Data B in row 9, and so on. This, however, cannot be achieved without some improvements on tester 100, as explained below.

Figure 3:
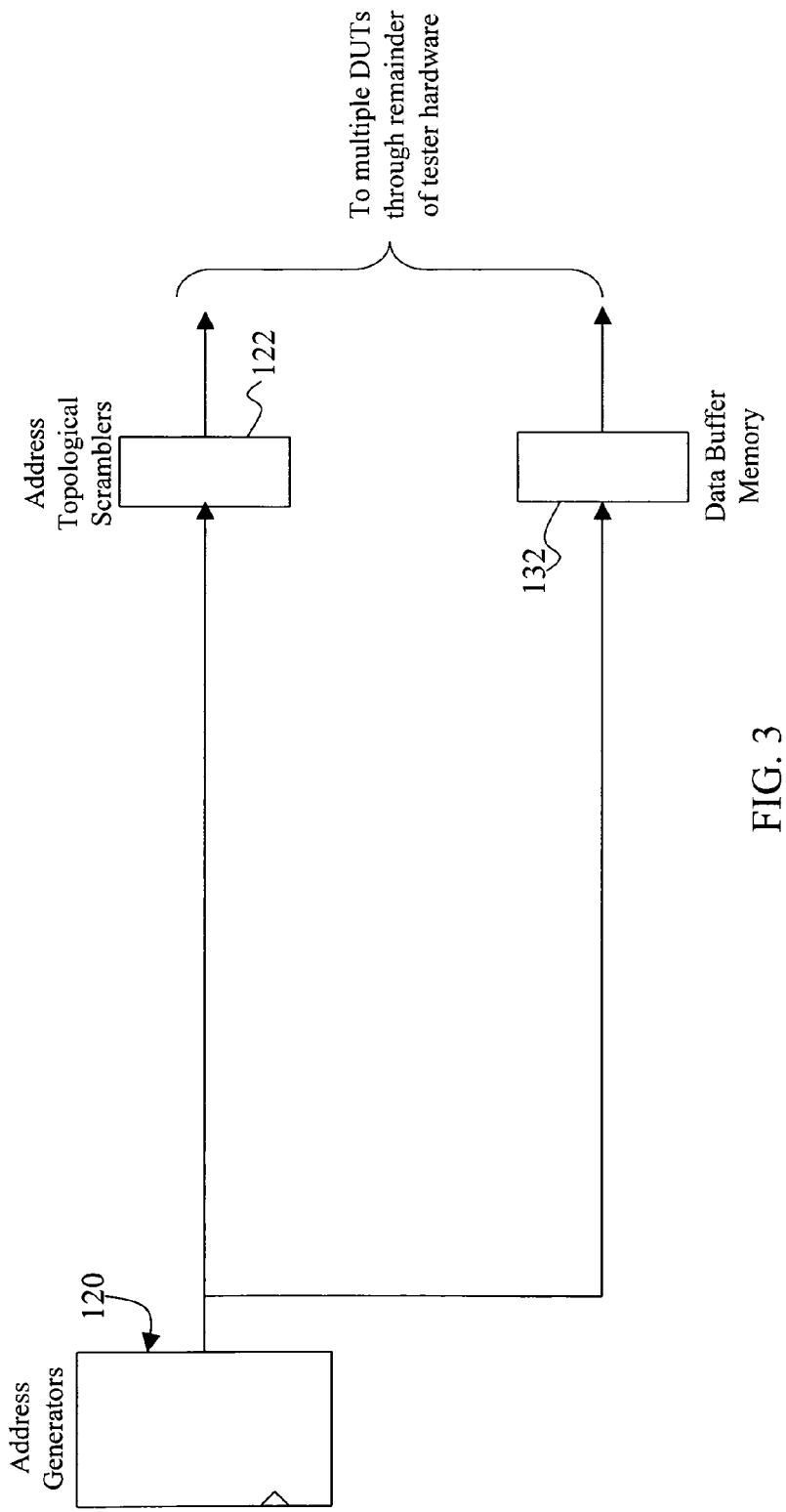
FIG. 3 is a block diagram illustrating part of the tester shown in FIG. 1.

To illustrate the problem, FIG. 3 shows part of tester 100 comprising address generator 120, address topological scramblers 122, and data buffer memory 132. Data buffer memory 132 is used to store non-algorithmic data patterns with which to program the DUT(s). This is where customer codes, such as video game code or cell phone operating system code, is stored in tester 100. Data buffer memory 132 is configured to be an image of each DUT with respect to row and column addresses and data width. The DUT address generated by address generator 120, including the row address, is sent to the address pins of the DUT(s) through the address topological scramblers 122, and also to data buffer memory 132. The address is used by data buffer memory 132 to retrieve the data pattern corresponding to the given address for transmission to the data pins of the DUT(s). If algorithmic test data is desired during the manufacturing process, Algorithmic data generator 130 (not shown in FIG. 3) may be substituted in place of the data buffer memory 132 by multiplexor 134 (not shown in FIG. 3).

Figure 4:
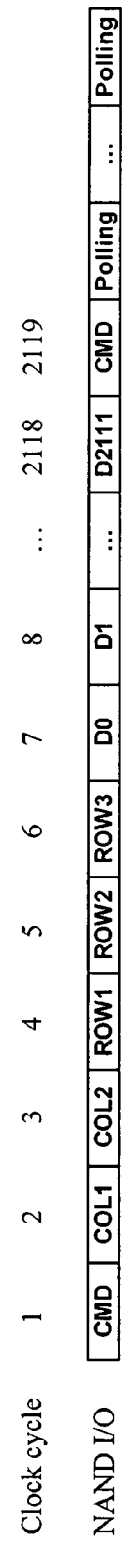
FIG. 4 is a block diagram of a command stream used by the tester shown in FIG. 1.

The data bus on a typical NAND Flash DUT is 8 bits wide. Thus, information exchanged between tester 100 and a typical NAND Flash DUT is multiplexed onto an 8-bit bus (not shown) and sent to and retrieved from the DUT in this width. For instance, a twenty-bit row address would take three clock cycles to send to the DUT. FIG. 4 shows a typical command stream for programming a series of non-algorithmic data patterns into a NAND Flash memory. In a first clock cycle, a set-up command (CMD) is sent to the NAND Flash memory DUT, such as DUT 300. In clock cycles 2 and 3, address generator 120 generates a column address that is sent to the DUT(s) through address topological scramblers 122 to identify a column or a starting one of a number of columns for loading the series of non-algorithmic data patterns. The column address is followed by a row address to identify a row of storage cells, such as row 0, or a starting one of a number of rows into which the data patterns are to be written. The number of rows and/or columns for loading the data patterns may be set by the command that was sent earlier. The row address is generated in clock cycles 4, 5, and 6 by address generator 120 and is sent to the DUT(s) through address topological scramblers 122. Afterwards, data input cycles occur in which a long string of 8 bit data words is sent to the DUT in clock cycles 7 through 2118 from data buffer memory 132. In clock cycle 2119, a command is sent for the NAND Flash to program the data into its non-volatile storage cells. At this point, the NAND Flash DUT goes into programming cycles and the tester goes into a polling loop interrogating the DUT's programming flag until the DUT signals that the programming cycles are complete. Polling typically takes as many or more clock cycles as tester 100 takes to load the data.

As illustrated in FIGS. 3 and 4, since address generator 120 in tester 100 has only one row address register to transmit row addresses to the pins of the DUT(s), the same row address has to be sent to all DUT(s) connected to tester 100. Thus, it is not possible for tester 100 to program DUT 300 and DUT 400 simultaneously because, as illustrated in FIG. 2, the data patterns such as Data A through Data H need to be programmed to different row addresses in the two DUTs. In NAND Flash device manufacturing, typically half the devices end up with some of the storage cells not functioning and require redundant storage elements to replace bad blocks. The problem gets more complicated and the tester efficiency decreases even further as more DUTs can be connected to tester 100 in parallel. The DUTs would have to be programmed serially, idling the test system hardware on the DUTs waiting and significantly increasing the overall cost of testing the DUTs. Therefore, customer codes, which are non-algorithmic, are rarely programmed into NAND Flash devices during manufacturing.

Figure 5:
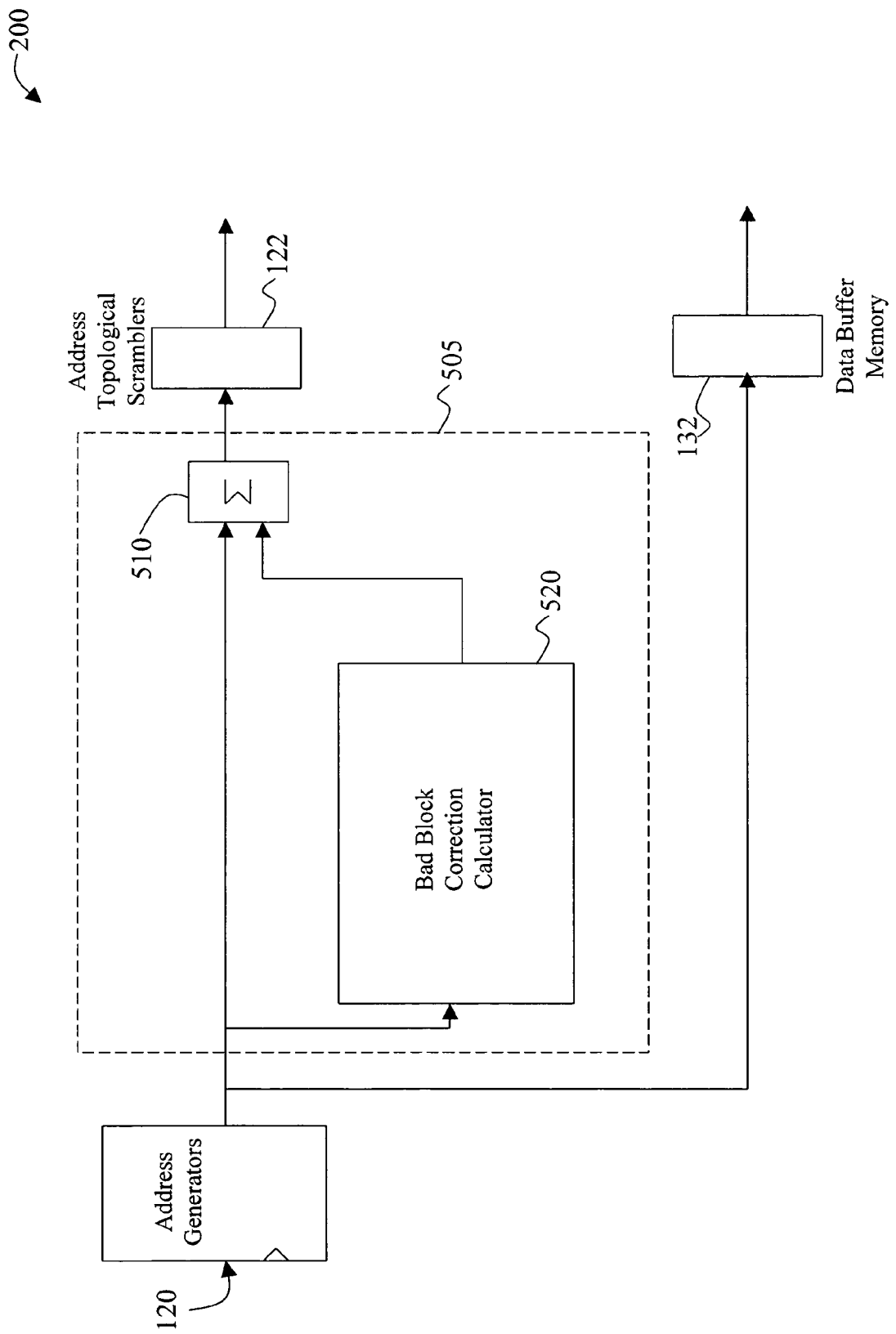
FIG. 5 is a block diagram illustrating an improved tester in accordance with an embodiment of the present invention.

FIG. 5 illustrates a tester 200 for testing multiple NAND Flash DUTs in parallel according to one embodiment of the present invention. For the sake of clarity, only part of tester 200 is shown in FIG. 5. While other components of tester 200 are similar to tester 100, tester 200 comprises an address adjuster 505 coupled between address generator 120 and the DUTs. Address adjuster 505 is configured to successively determine whether a storage unit (such as a row or a block of storage cells) corresponding to the memory address in each DUT is inoperable and, in response to the determination that the storage unit is inoperable, to generate a modified address to bypass a collection of storage locations in the DUT. The collection of storage locations comprises the inoperable storage unit in the specific DUT. The modified address for each DUT is provided to the respective DUT.

In one embodiment of the present invention, as shown in FIG. 5, the address adjuster comprises an adder 510 coupled between address generator 120 and address topological scramblers 122, and a bad block correction calculator (BBCC) 520 coupled between the address generator 120 and adder 510. When more than one DUTs are being programmed by tester 200 in parallel, BBCC 520 stores information regarding locations of bad blocks in each of the DUTs and is configured to determine, for each row address generated by the address generator 120 and for each DUT being programmed, whether the row address points to a bad block in the DUT. In response to the determination that the row address corresponds to a bad block in the DUT, such as the bad block 430 in DUT 400 shown in FIG. 2, BBCC 520 is further configured to produce an offset to adder 510, which adds the offset to the row address from address generator 120 to output a modified row address to address topological scramblers 122. The modified row address steps over the bad block (e.g., block 430) or a series of contiguous bad blocks to point at the next good block (e.g., block 440) after the bad block in the DUT.

The address delivered to data buffer memory 132 is unaltered, so that the data in data buffer memory 132 corresponding to the original row address is accessed and sent to the DUT aligned with the modified row address from address topological scramblers 122, which points to the good block. To prevent the good block (e.g., block 440) from being overwritten when address generator 120 later generates another row address that points to the good block, BBCC is further configured to accumulate the offsets it generates for each DUT and the accumulated offset is added to each later generated row address by adder 510 to shift the row address accordingly, as explained in more detail below.

Figure 6:
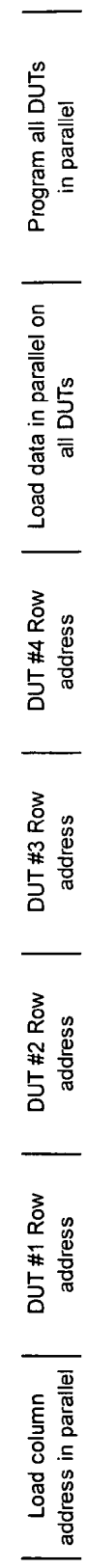
FIG. 6 is a block diagram illustrating command streams used by the improved tester shown in FIG. 5.

FIG. 6 shows an example of waveforms for programming in parallel four NAND Flash DUTs connected to tester 200 (DUT #1, DUT #2, DUT #3, and DUT #4) according to one embodiment of the present invention. As shown in FIG. 5, all four DUTs are enabled and given a CMD and column address in parallel in clock cycles 1, 2, and 3. Then, the four DUTs are given potentially different row addresses successively in clock cycles 4 through 16. To supply the potentially different row addresses, for each row address and successively for each of the four DUTs, address adjuster 505 determines whether the row address points to a bad block and generates a modified row address accordingly. The modified row address bypasses a number of contiguous bad blocks including the bad block pointed to by the row address, and the number is likely to be different for each DUT.

Thus, for each DUT, a potentially different modified row address is produced and given to the DUT. As shown in FIG. 6, the modified row address for DUT #1 is sent to DUT #1 in clock cycles 4, 5, and 6 while all other three DUTs are disabled from writing and left in a "wait" state; the modified row address for DUT #2 is sent to DUT #2 in clock cycles 7, 8, and 9 while all other three DUTs are disabled from writing and left in the wait state; the modified row address for DUT #3 is sent to DUT #3 in clock cycles 10, 11, and 12 while all other three DUTs are disabled from writing and left in the wait state; and the modified row address for DUT #4 is sent to DUT #4 in clock cycles 13, 14, and 15 while all other three DUTs are disabled from writing and left in the wait state. In this example, a row address of up to 24 bits can be sent in the three cycles for sending the row address.

After the four DUTs are written with potentially different row addresses in a serial fashion, as shown in FIG. 6, data input cycles occur in clock cycles 17 through 2127, in which a long string of 2112 data words is loaded on all DUTs in parallel. In this example of programming four NAND Flash DUTs using one address generator 120, the additional overhead is nine extra clock cycles in addition to the thousands of clock cycles consumed in loading the program data. With the programming cycles equal to or longer than the data input cycles in length, this means that the excess overhead percentage is less than or equal to: 9 excess cycles/(1 CMD cycle+2 column cycles+3 row cycles+2118 data cycles+2118 programming cycles)=0.2. In other words, the parallel programming in this example is 99.8% or more efficient.

Figure 7:
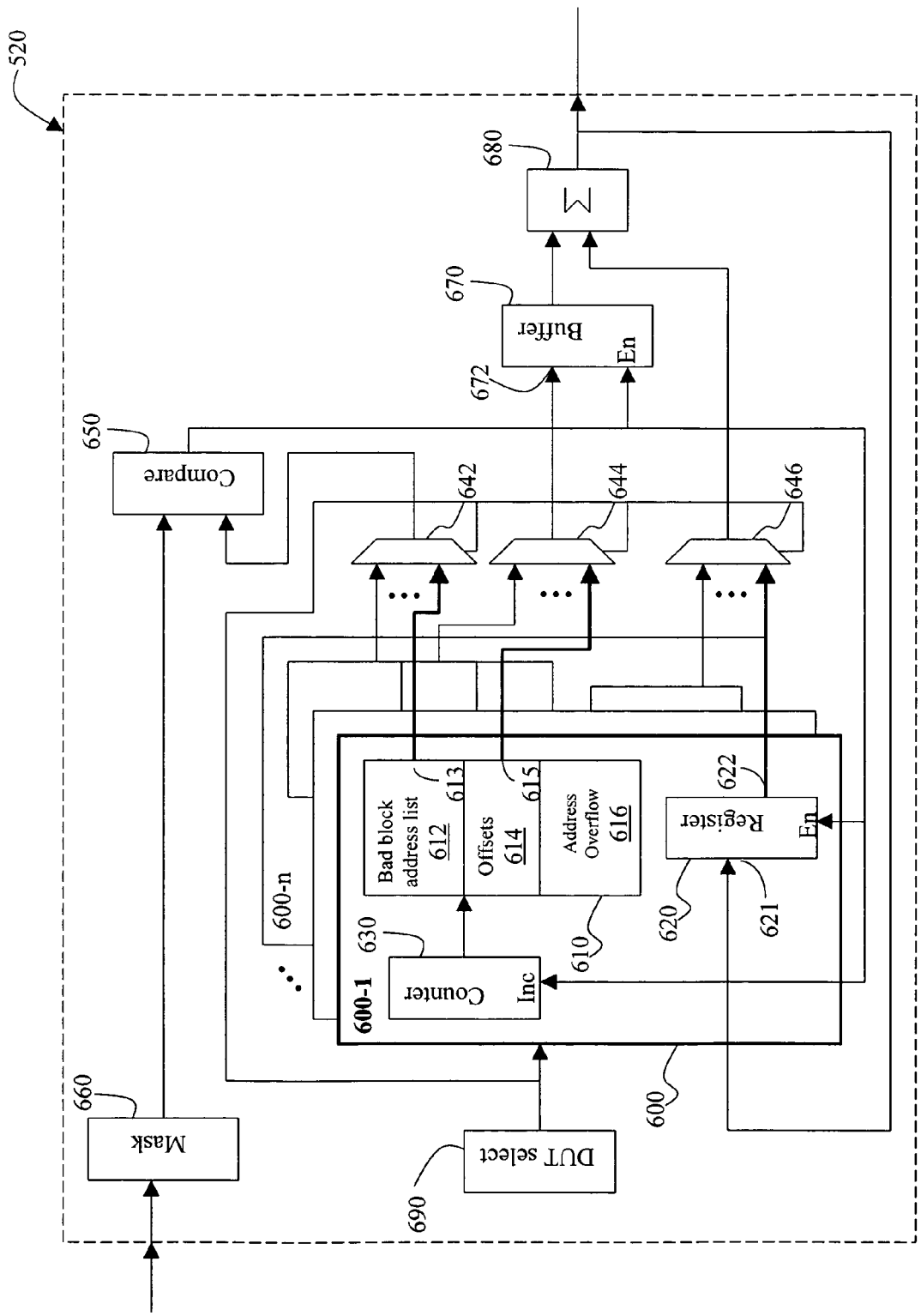
FIG. 7 is a block diagram of a bad block correction calculator in the improved tester in accordance with an embodiment of the present invention.

FIG. 7 illustrates an implementation of BBCC 520 according to one embodiment of the present invention. As shown in FIG. 7, BBCC 520 comprises storage blocks 600-1 through 600-n, each for one of n Flash Memory DUTs, DUT-1 through DUT-n, respectively, that are being tested in parallel by tester 200, where n is an integer larger than 1. Each, some, or all of storage blocks 600-1 through 600-n may be referred to hereafter as storage block(s) 600. As also shown in FIG. 7, each storage block 600 comprises a RAM 610, a holding register 620, and a counter 630. RAM 610 in each storage block 600 stores information related to locations of bad blocks in the corresponding DUT according to a bad block table that has been obtained after an initial round of testing of the Flash memory array in the DUT. The information includes a bad block address list 612, offsets associated with the bad block address list 614, and an address overflow 616. The bad block address list 612 comprises a list of entries corresponding sequentially to bad block addresses, from a minimum bad block address to a maximum bad block address. If there are contiguous bad blocks, the contiguous bad blocks are grouped so that only information related to the address of the first bad block in the group is entered in the bad block address list 612 and an associated offset is stored as one of the offsets 614 in RAM 610. The offset indicates the number of bad blocks or the number of rows in the group of bad blocks and is associated with the particular bad block address in the bad block address list 612. The address overflow bit comprises a bit for indicating an address overflow condition (e.g., a condition where the modified address is beyond the legitimate addresses of the DUT). Since the bad block information is known before programming begins, an address overflow condition can be detected and the address overflow bit is set. The address overflow bit 616 can be used to halt programming on the corresponding DUT or set other alarm conditions to be dealt with as desired when as address overflow condition occurs.

BBCC 520 further comprises multiplexors 642, 644, and 646, each having n data inputs coupled to respective ones of the n storage blocks 600. The data inputs of multiplexor 642 are coupled to bad block address outputs 613 of respective ones of the n storage blocks; the data inputs of multiplexor 644 are coupled to offset outputs 615 of respective ones of the n storage blocks; and the data inputs of multiplexor 646 are coupled to holding register outputs 622 of respective ones of the n storage blocks. BBCC 520 further comprises an address compare circuit 650 having one input coupled to multiplexor 642 and another input coupled to address generator 120 in FIG. 5 through an optional mask register 660, a buffer 670 having a data input 672 coupled to an output of multiplexor 644 and an enable terminal (En) coupled to an output of compare circuit 650, and an adder 680 having a first input coupled to an output of buffer 670, a second input coupled to an output of multiplexor 646, and an output coupled to adder 510 in FIG. 5. The output of adder 510 is additionally coupled to a data input 621 of each holding register 620, and the output of compare circuit 650 is additionally coupled to an input of counter 630. BBCC 520 further comprises a DUT selection register (DUT select) 690 coupled to each of storage blocks 610 and to a control input of each of multiplexors 642, 644, and 646, and is configured to successively select one of the storage blocks 610 for producing an offset that may modify a row address generated by address generator 120.

Figures 8A, 8B, 8C:
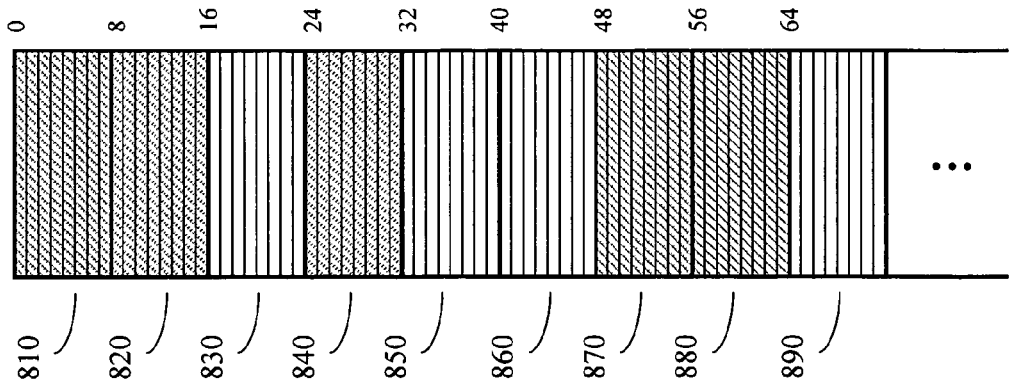
FIG. 8A is a block diagram of a column of storage cells in one of a plurality of memory devices tested by the improved tester.
FIG. 8B is a block diagram of a bad block address list and offsets stored in the bad block correction calculator in accordance with an embodiment of the present invention.
FIG. 8C is a block diagram of a bad block address list and offsets stored in the bad block correction calculator in accordance with an alternative embodiment of the present invention.

To illustrate operation of BBCC 520, a column in DUT-1 having bad blocks 810, 820, 840, 870, 880, interleaved with good blocks 830, 850, 860, 890, is shown in FIG. 8A, and a portion of the bad block address list 612 and associated offsets 614 in storage block 600-1 is shown in FIG. 8B. In this embodiment, to simplify hardware configurations, each bad block address is adjusted before being entered in the bad block address list 612 to account for the number of rows in the bad blocks above the addressed bad block. The reason for doing so will become clear in the discussions that follow. Before DUT programming starts, holding register 620 in each storage block 600 is initialized to zero, counter 630 in each storage block 600 is initialized to point to the first entry (e.g., entry of 0 for bad block 810) in the corresponding bad block address list 612, and DUT select 690 is initialized to select a first storage block (e.g., storage block 600-1) corresponding to a first DUT (e.g., DUT-1). Simultaneous with selecting storage block 600-1, DUT select 690 also causes multiplexors 642, 644, and 646 to select outputs from storage block 600-1. Multiplexor 642 is thus configured to produce the first entry (e.g., entry of 0 for bad block 810) in the bad block address list 612 of storage block 600-1 to compare circuit 650, which is configured to compare the first entry to successive ones of the addresses coming from address generator 120. Optional Mask Register 660 allows particular address bits to be masked off, or ignored, by compare circuit 650 so that bad blocks instead of rows in bad blocks are detected. Without Mask Register 660, the BBCC 520 operates on a row-by-row or address-by-address basis.

Using the example shown in FIGS. 8A and 8B while still referring to FIG. 7, when address generator 120 generates an address for row 0, bad block 810 is hit and compare circuit 650 produces a valid compare so that buffer 670 is enabled, holding register 620 in storage block 600-1 is also enabled, and counter 630 is incremented by 1 to point to the next entry (e.g., entry of 8 for bad block 840) in the bad block address list 612 for the next clock cycle. As buffer 670 is enabled, it allows the offset (e.g., offset of 2 blocks) associated with the first entry in the bad block address list 612 coming to buffer 670 through multiplexor 644, to go through and reach adder 680. Adder 680 adds this offset to the accumulated offset (which is now 0) from the corresponding holding register 620, the accumulating offset coming to adder 680 through multiplexor 646, and sends the result to adder 510 in FIG. 5. Adder 510 uses the result from adder 680 to modify the address generated by address generator 120, as discussed above, so that the address for row 0 is shifted two blocks to the address of row 16, which is the first row of the next good block, block 830. Adder 680 also sends the result to the corresponding holding register 620, which result is clocked in the holding register during the next clock cycle. Since the storage blocks 600-2 through 600-n corresponding to the other DUTs are not selected by DUT select 690, the holding registers 620 in these unselected storage blocks are not enabled by the valid compare from comparator 650 and do not take the result from adder 680.

While address generator 120 continues to produce the same row address, DUT select 690 then selects DUT-2 so that storage block 600-2 is selected, and events similar to what is described above occur except that a potentially different offset may be generated by adder 680 and accumulated in the holding register 620 in storage block 600-2 depending on the bad block configurations in DUT-2. For example, the row address may point to a good block in DUT-2 so that compare circuit 650 does not produce a valid compare and buffer 670 is not enabled and outputs a zero for adder 680. As a result, what is stored in holding register 620 in storage block 600-2 goes through adder 680 unmodified. Since holding register 620 is initialized to hold a zero offset, adder 680 should also produce a zero offset so that the row address goes through adder 510 in FIG. 5 unmodified. After DUT select 690 has successively selected each of the storage blocks 600 a series of data loading and programming cycles as shown in FIG. 6 occur before the next round of address loading cycles begins with DUT select 690 selecting DUT-1 again. DUT selection register 690 can be programmed by a user of the test system on a cycle-by-cycle basis or can be configured to run automatically throughout the programming of the DUTs, relieving the user of the burden of manipulating the hardware.

Since discussions related to the other DUTs are similar, only DUT-1 will be discussed in detail in the following. After the first bad block hit when address generator generates the address for row 0, counter 630 is incremented to point at the next entry (e.g., the entry of 8 for bad block 840) in the bad block address list 612. When address generator subsequently generates row addresses for rows 2 through 7, compare circuit 650 does not generate valid compares. As a result, buffer 670 is not enabled and what is stored in holding register 620 goes through adder 680 to adder 510 in FIG. 5, which consequently shifts the addresses for rows 2 through 7 by two blocks to the address for rows 17 through 23, respectively. When address generator 120 generates a row address for row 8, because of the adjustment made to the address for bad block 840 in the bad block address list 612, compare circuit 650 outputs a valid compare indicating the next entry in the bad block list 612 is hit. Thus, instead of shifting the row address two blocks again to land in another bad block, block 840, buffer 670 is enabled and causes the offset of 1 associated with the entry of 8 in the bad block list 612 to be added to what has been stored in the holding register 620. As a result, an offset of 3 blocks is produced by adder 680 and is sent to adder 510 in FIG. 5 and to holding register 620 to overwrite the previously stored accumulated offset. This offset of 3 sent to adder 510 causes the address for row 8 to be shifted to row 32, which is the first row in good block 850 next to bad block 840. Therefore, BBCC 520 allows bad blocks to be continually bypassed during programming.

Figure 9A:
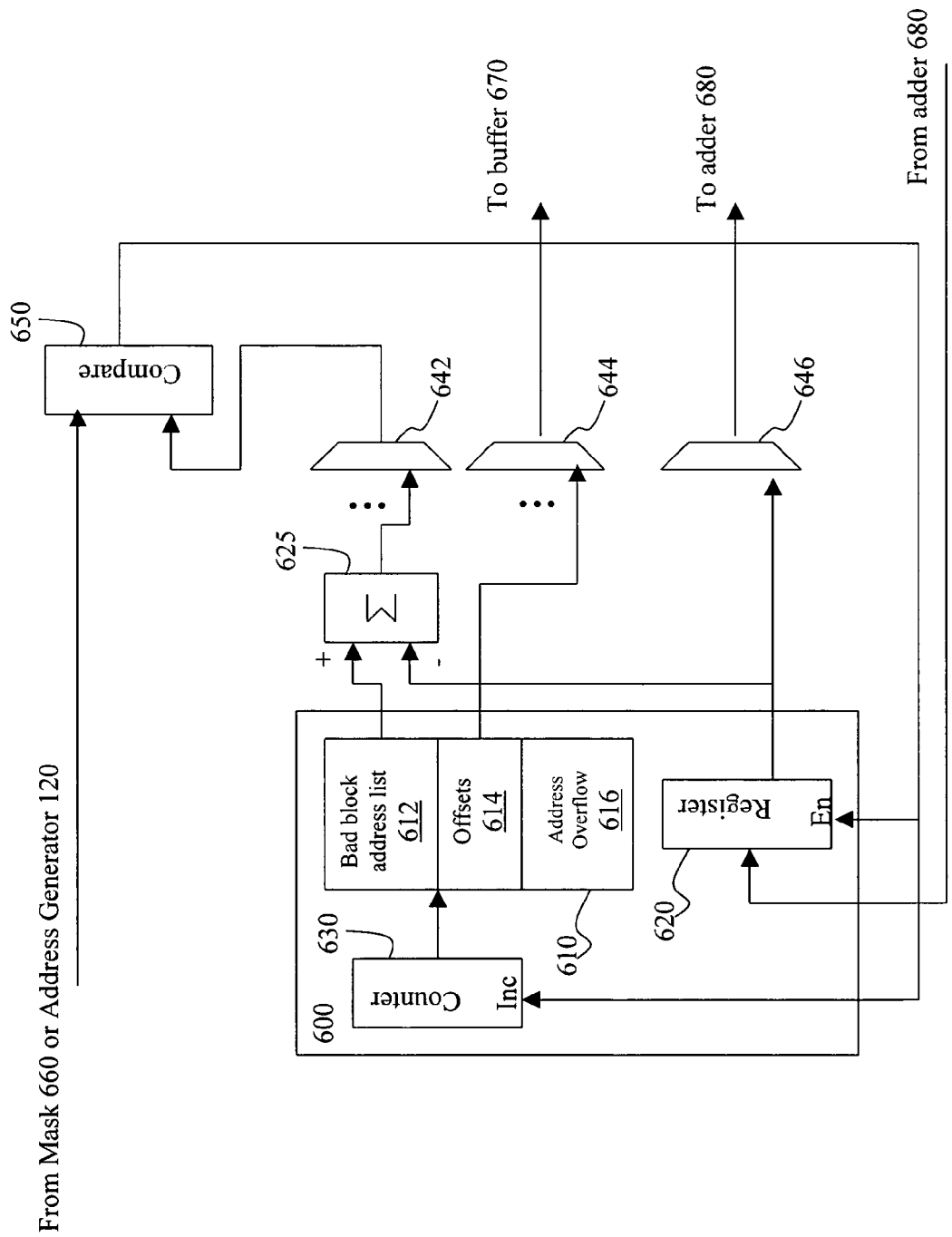
FIG. 9A is a block diagram of part of the bad block correction calculator in accordance with an alternative embodiment of the present invention.
Figure 9B:
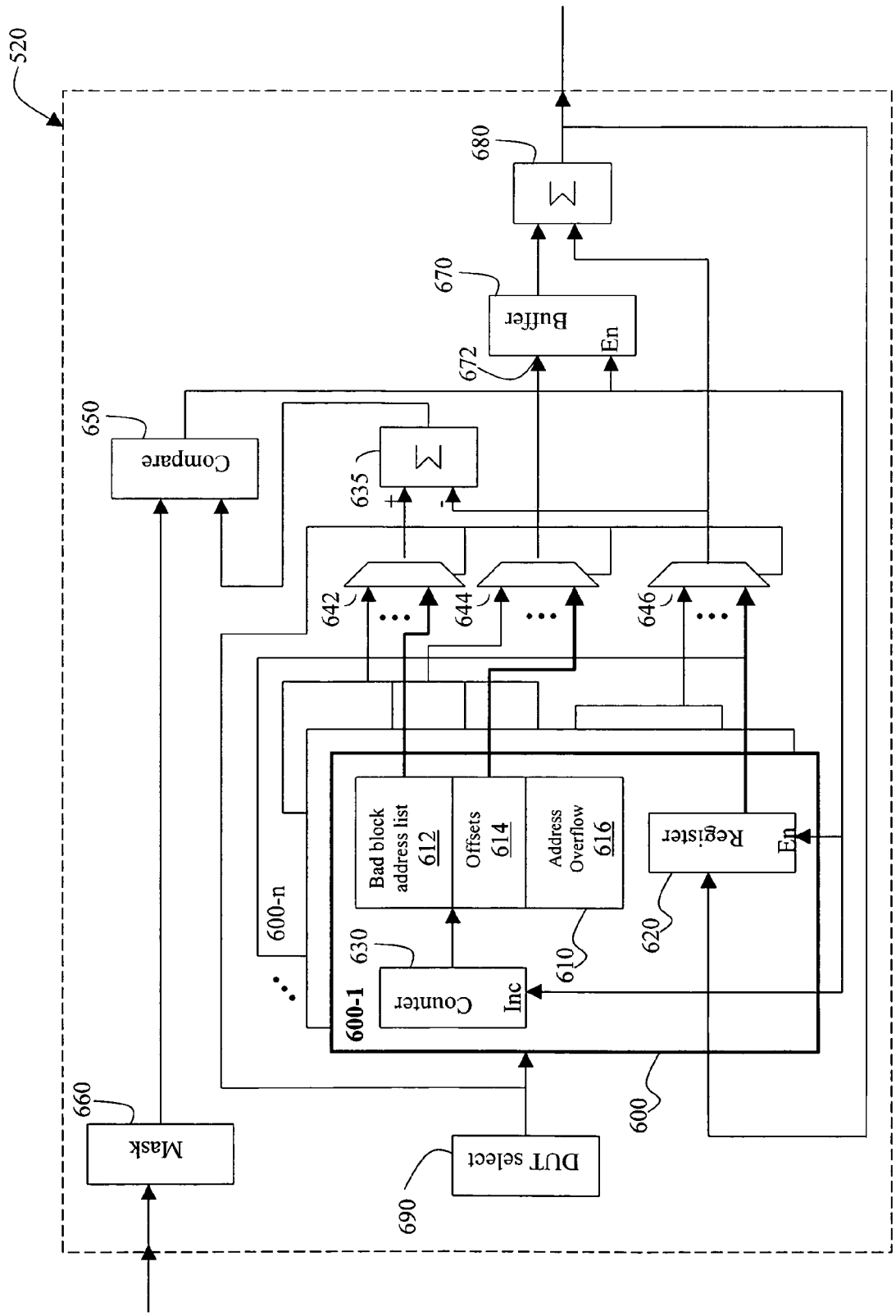
FIG. 9B is a block diagram of the bad block correction calculator in accordance with yet another alternative embodiment of the present invention.

FIGS. 5 and 7 illustrate only one implementation of address adjuster 505. The implementation can be changed without departing from the spirit and scope of the present invention. For example, as discussed above in association with FIG. 8B, in one embodiment of the present invention, each bad block address is adjusted before being entered in the bad block address list 612 to account for the number of rows in the bad blocks above the addressed bad block. The adjustment can be done in software to simplify hardware configurations. In an alternative embodiment of the present invention, no adjustment is made and the bad block addresses are directly entered in the bad block address list 612 as shown in FIG. 8C. Instead, hardware modifications illustrated in FIG. 9A or 9B are made on BBCC 520 to make sure that bad blocks are continually bypassed. As shown in FIG. 9A, which illustrates a portion of BBCC 520, the hardware modifications include an adder 625 coupled to holding register 620 and the bad block address output 613 of each storage block 600 and is configured to subtract what is stored in holding register 620 from the bad block address before it is sent to compare circuit 650. Alternatively, as shown in FIG. 9B, instead of an adder 625 for each storage block 600, the hardware modification may include only one adder 635 coupled to the outputs of multiplexors 642 and 644 and configured to subtract the output of multiplexor 646 from that of multiplexor 642 and to send the result to comparator 650. Like adder 625 or 635, other parts in tester 200 may also be substituted by equivalents known to those in the art or by software.

This invention has been described in terms of a number of embodiments, but this description is not meant to limit the scope of the invention. Numerous variations will be apparent to those skilled in the art, without departing from the spirit and scope of the invention disclosed herein. Furthermore, certain aspects of the present invention have been described in terms of components in a tester, while these components may be used outside of tester in other applications.

We claim:

1. A method for programming first and second memory devices arranged in parallel and each including at least one memory bank with a plurality of storage locations and being configured to at least one of receive and store data and retrieve and transmit data associated with the plurality of storage locations, the method comprising:

providing successively a first address to the first memory device and a second address that is different than the first address to the second memory device, the first address referring to a first group of the plurality of storage locations in the first memory device and the second address referring to a second group of the plurality of storage locations in the second memory device;

determining if the first address matches a stored first bad address in the first memory device so as to constitute an inoperable storage unit;

determining if the second address matches a stored second bad address in the second memory device so as to constitute an inoperable storage unit;

generating a first modified memory address and a second modified memory address in response to the determination that the first and second addresses respectively match first and second bad addresses by adding a first accumulated offset that includes a first sum of memory address offsets to the first address and a second accumulated offset that includes a second sum of memory address offsets to the second address;

providing the first and second accumulated offsets in a feedback loop to respective first and second registers;

providing the first and second modified memory addresses to the memory devices; and loading in parallel a string of data to the first and second memory devices whereby the string of data is written simultaneously to each of the first and second groups of the plurality of storage locations.

2. The method of claim 1 wherein the first and second addresses are row addresses and the method further comprises providing in parallel a common column address to the first and second memory devices prior to providing successively the first address to the first memory device and the second address to the second memory device.

3. The method of claim 2 wherein the loading step includes loading the string of data simultaneously to storage locations referred to by the common column address and the first row address in the first memory device and to storage locations referred to by the common column address and the second row address in the second memory device.

4. A method for simultaneously programming first and second memory devices arranged in parallel and each including at least one memory bank with a plurality of storage locations, the method comprising generating a first memory address, determining if the first memory address matches a stored bad address, obtaining a first address offset associated with the bad address if the first memory address matches a stored bad address, combining the first address offset with an accumulated offset that includes a sum of offsets to obtain a second address offset, providing the second address offset in a feedback loop to a holding register as a new accumulated offset, generating a second memory address based on the first memory address and the second address offset, and loading a string of data into a memory location referred by the second memory address.

5. The method of claim 4 wherein the determining step includes producing an entry from a bad block address list, the entry corresponding to a bad block in the memory device, and comparing the entry with the first memory address.

6. The method of claim 4 wherein the generating step includes adding the second address offset to the first memory address.

7. A system for simultaneous programming first and second memory devices arranged in parallel comprising an address generator configured to generate a memory address, an address adjuster coupled between the address generator and the first and second memory devices and including a bad block correction calculator configured to determine whether a storage unit corresponding to the memory address in the first memory device is an inoperable storage unit and, in response to the determination that the storage unit is an inoperable storage unit, to combine a first offset associated with the memory address and an accumulated offset that includes a sum of memory address offsets in order to produce a second offset, to provide the second offset in a feedback loop to a holding register as a new accumulated offset, and to combine the second offset with the memory address to produce a first modified address for delivery to the first memory device to bypass a first collection of storage locations in the first memory device that includes the inoperable storage unit.

8. The system of claim 7 wherein the address adjuster comprises:

an adder configured to add the offset to the memory address to generate the first modified address.

9. The system of claim 8 wherein the bad block correction calculator comprises storage blocks for storing information related to inoperable storage units in each of the first and second memory devices, a device selector configured to select a storage block associated with the first memory device and a comparator configured to compare the memory address with a stored address retrieved from the selected storage block to determine whether the storage unit corresponding to the first address in the first memory device is an inoperable storage unit.

10. The system of claim 9 wherein the information related to inoperable storage units in the first memory device comprises a bad block address list and offsets associated with respective entries in the bad block address list.

11. The system of claim 10 wherein the bad block address list comprises entries each corresponding to an address of a bad block and the offset associated with each entry indicates a number of contiguous bad blocks for the entry.

12. The system of claim 10 further comprising a holding register associated with each storage block, the holding register storing the accumulated offset, and an adder configured to add the accumulated offset from the holding register associated with the selected storage block to the first offset retrieved from the selected storage block to generate the second offset.

13. The system of claim 9 further comprising at least one multiplexor configured to select an output among outputs from the storage blocks.

14. The system of claim 7 wherein the address generator is configured to repeat the generation of the memory address, the address adjuster is configured to determine whether a storage unit corresponding to the memory address in the second memory device is an inoperable storage unit and, in response to the determination that the storage unit is an inoperable storage unit, to generate a second modified address to bypass a second collection of storage locations in the second memory device, the collection of storage locations comprising the inoperable storage unit in the second memory device, the second modified address being provided to the second memory device subsequent to the first modified address being provided to the first memory device.

15. The system of claim 14 wherein the first modified address refers to a first group of storage locations in the first memory device and the second modified address refers to a second group of storage locations in the second memory device, and the system comprises a data buffer memory storing therein data patterns corresponding to the first group of storage locations in the first memory device and the second group of storage location in the second memory device, the data buffer memory being configured to output the data patterns to the first memory device and to the second memory device in parallel whereby the data patterns are written simultaneously to each of the first group of storage locations and the second group of storage locations.

16. The method of claim 4 wherein the loading step includes loading a string of data corresponding to the first memory address into a memory location referred by the second memory address.

17. The method of claim 1 wherein the generating step comprises obtaining a first bad address offset associated with the stored first bad address and adding the first bad address offset to an accumulated offset to generate the first sum of memory address offsets.

18. The method of claim 17, wherein the first bad address offset is indicative of a number of contiguous bad addresses.

* * * * *